United States Patent
Usui et al.

(10) Patent No.: US 7,808,114 B2
(45) Date of Patent: Oct. 5, 2010

(54) CIRCUIT DEVICE AND METHOD OF MANUFACTURING THEREOF

(75) Inventors: Ryosuke Usui, Aichi (JP); Yasunori Inoue, Gifu (JP); Hideki Mizuhara, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 112 days.

(21) Appl. No.: 11/410,476

(22) Filed: Apr. 24, 2006

(65) Prior Publication Data
US 2006/0252232 A1   Nov. 9, 2006

(30) Foreign Application Priority Data
Apr. 28, 2005   (JP)   .................... P2005-131130

(51) Int. Cl.
*H01L 23/52* (2006.01)
(52) U.S. Cl. .............. 257/780; 257/779; 257/786; 257/E23.011; 257/E23.021
(58) Field of Classification Search ............. 257/773, 257/779, 780, 784, 786, 23.01, 23.011, 23.021
See application file for complete search history.

(56) References Cited

U.S. PATENT DOCUMENTS

| | | | |
|---|---|---|---|
| 5,451,801 A * | 9/1995 | Anderson et al. | 257/202 |
| 6,359,221 B1 * | 3/2002 | Yamada et al. | 174/549 |
| 6,610,558 B2 * | 8/2003 | Chen | 438/106 |
| 6,936,769 B1 * | 8/2005 | Noguchi et al. | 174/535 |
| 2003/0207574 A1 * | 11/2003 | Aiba et al. | 438/689 |
| 2004/0041251 A1 * | 3/2004 | Goller et al. | 257/690 |
| 2005/0017343 A1 * | 1/2005 | Kwon et al. | 257/698 |
| 2005/0230846 A1 * | 10/2005 | Chang et al. | 257/780 |
| 2006/0022350 A1 * | 2/2006 | Watkins | 257/779 |

FOREIGN PATENT DOCUMENTS

| | | |
|---|---|---|
| JP | 09-064049 | 3/1997 |
| JP | 09-275125 | 10/1997 |
| JP | 2000-269269 | 9/2000 |
| JP | 2001-223287 | 8/2001 |
| JP | 2004-039761 | 2/2004 |

\* cited by examiner

*Primary Examiner*—Matthew E Warren
(74) *Attorney, Agent, or Firm*—Fish & Richardson P.C.

(57) ABSTRACT

A circuit device of preferred embodiments of the present invention includes: a circuit element with electrodes formed in a peripheral part thereof; connecting portions connected to surfaces of the electrodes; and redistribution lines which are continuous to the respective connecting portions and extended in parallel to the main surface of the circuit element. In preferred embodiments of the present invention, the connecting portions and the redistribution lines are integrally formed of one piece of metal. Accordingly, there is no place where different materials are connected in a portion between the connecting portions and the redistribution lines, thus improving a joint reliability of the entire device against a thermal stress or the like.

14 Claims, 7 Drawing Sheets

CIRCUIT DEVICE AND METHOD OF MANUFACTURING THEREOF

Priority is claimed to Japanese Patent Application Number JP2005-131130 filed on Apr. 28, 2005, the disclosure of which is incorporated herein by reference in its entirety.

BACKGROUND OF THE INVENTION

1. Field of the Invention

The present invention relates to a circuit device and a method of manufacturing thereof, and specifically, relates to a circuit device of a size equal to a size of a circuit element and a method of manufacturing thereof.

2. Description of the Related Art

When electronic equipment such as mobile phones are miniaturized and sophisticated, circuit devices used in such equipment are also required to be further miniaturized.

A structure to package a highly-integrated circuit element has changed from a conventional QFP (Quad Flat Package) to a CSP (Chip Size Package). The CSP packages are formed by dicing a wafer which has external connection electrodes formed on a main surface thereof. Accordingly, each of the CSP packages is capable of being bonded to a mounting substrate with a size equal to that of the circuit element, and a side of the mounting substrate on which the CSP packages are mounted is capable of being miniaturized. Employing the CSP, therefore, enables an entire set of a mobile phone or the like to be miniaturized.

In the CSP, redistribution lines are formed on a main surface of the circuit element to redistribute electrodes of the circuit element. The electrodes of the circuit element are usually formed in a peripheral part of the circuit element which is not an area where integrated circuits are formed. A pitch between these electrodes is, for example, 70 μm and is very small, which makes solder connection difficult. The redistribution lines are therefore formed on the main surface of the circuit element in order to arrange external electrodes connected to the electrodes in a matrix. A pitch between the external electrodes is, for example, about 500 μm, which facilitates the solder connection.

With reference to FIG. 7, a description is given of a circuit device 100 of the conventional CSP type. The circuit device 100 includes an integrated circuit formed on a surface of a circuit element 101, and electrodes 104 which are connected to this integrated circuit are arranged in a peripheral part of the circuit device 100. The surface of the circuit element 101 is coated with a protection film 102 except in places where the electrodes 104 are exposed. The protection film 102 is a PSG (phospho-silicate-glass) film, a $Si_3N_4$ (silicon nitride) film, or the like.

Bumps 108 are formed on the respective electrodes 104 by a wire bonding technique and have a shape with an upper part constricted. Each of the bumps 108 is coated with a resin layer 103 except in an upper surface.

On an upper surface of the resin layer 103, redistribution lines 106 electrically connected to the respective bumps 108 are extended. Each redistribution line 106 is extended inward from the respective electrodes 104 located in the peripheral part of the circuit element 101. The redistribution lines 106 are coated with a resist 109 except in places where external electrodes 107 made of solder or the like are formed. This technology is described for instance in the Japanese Patent Application Publication No. Hei 9-64049.

However, in the aforementioned circuit device 100 of the conventional type, each path from the electrodes 104 to the respective redistribution lines 106 is made of different materials, thus causing a problem of poor joint reliability. Specifically, the bumps 108 were made of gold, copper, solder, or the like, and the redistribution lines 106 are generally made of copper. Therefore, the bumps 108 and the redistribution lines 106 are made of different materials in some cases, and thermal stress occurs in an interface therebetween following a change in temperature. Accordingly, disconnection may occur where the bumps 108 are joined with the respective redistribution lines 106. Furthermore, a shape of the bumps 108 is not a shape which is deformed following a thermal stress, which added to the problem.

Furthermore, because of the bumps 108, this conventional type is not capable of being applied to a miniaturized circuit element. A diameter of the bumps 108 formed by the wire bonding technique is about 30 to 60 μm, and the electrode 104 needed to be larger than that. Accordingly, there is a problem that the bumps 108 cannot be formed in a circuit element having minute electrodes with a side length of not more than 30 μm.

Still furthermore, there is a problem that forming the bumps 108 by the wire bonding technique increases manufacturing costs of the CSP.

SUMMARY OF THE INVENTION

The present invention is made in the light of the aforementioned problems, and a primary object of the present invention is to provide an improved circuit device with an improved joint reliability and a method of manufacturing thereof.

The present invention provides a circuit device that includes a circuit element, a connecting portion connected to an electrode of the circuit element, and a redistribution line which is continuous to the connecting portion and extended in parallel to a main surface of the circuit element substantively, wherein the connecting portion and the redistribution line are integrally formed of one piece of metal.

Furthermore, in the circuit device of the present invention, the redistribution line and the connecting portion are made of rolled metal.

Furthermore, in the circuit device of the present invention, the redistribution line is coated with a resist and that a post continuous to the redistribution line is exposed to an outside of the circuit device by penetrating the resist.

Furthermore, in the circuit device of the present invention, the post is formed of a metal integrated with the connecting portion and the redistribution line.

The present invention provides a method of manufacturing a circuit device. The method includes preparing a semiconductor wafer having an electrode connected to each of integrated circuits on a surface thereof, providing an isolation trench on a surface of a conductive foil to form a connecting portion protruded in a position corresponding to a position of the electrode, superimposing the semiconductor wafer on the conductive foil to connect the connecting portion and the electrode, filling a space between the semiconductor wafer and the conductive foil with a filling resin, patterning the conductive foil to form a redistribution line for each of the integrated circuits, and dicing the semiconductor wafer to separate the semiconductor wafer into individual circuit elements.

Furthermore, in the method of manufacturing a circuit device of the present invention, the isolation trench is filled with a first filling resin to cause an upper surface of the connecting portion to be exposed, before the semiconductor wafer is superimposed on the conductive foil, and in that a space between the first filling resin and the semiconductor wafer is filled with a second filling resin after the semiconductor wafer is superimposed on the conductive foil.

BRIEF DESCRIPTION OF THE INVENTION

DETAILED DESCRIPTION OF THE PREFERRED EMBODIMENTS

Hereinafter, a description is given of embodiments of the present invention with reference to drawings.

Figure 1A:
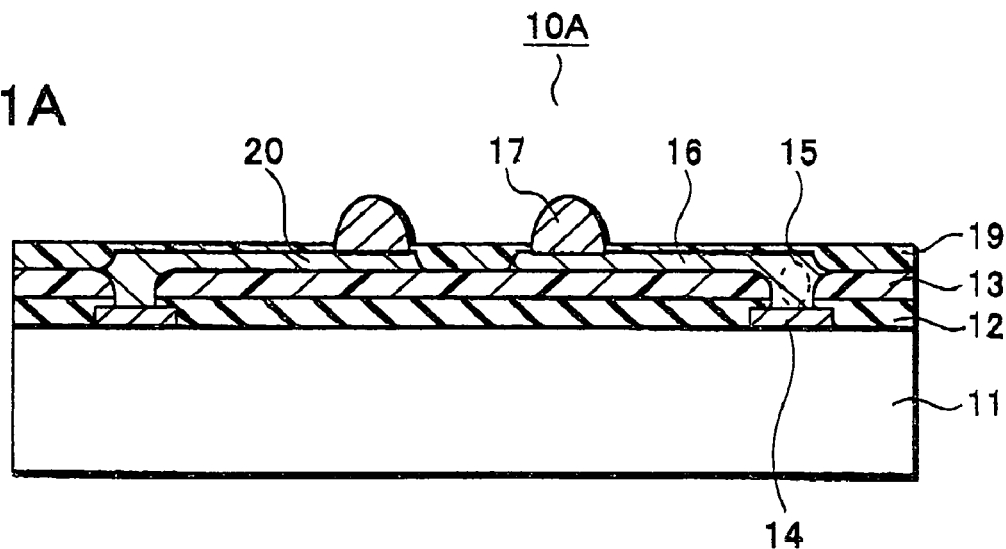
FIGS. 1A and 1B are a cross-sectional view and a plan view showing a circuit device of preferred embodiments of the present invention, respectively.
Figure 1B:
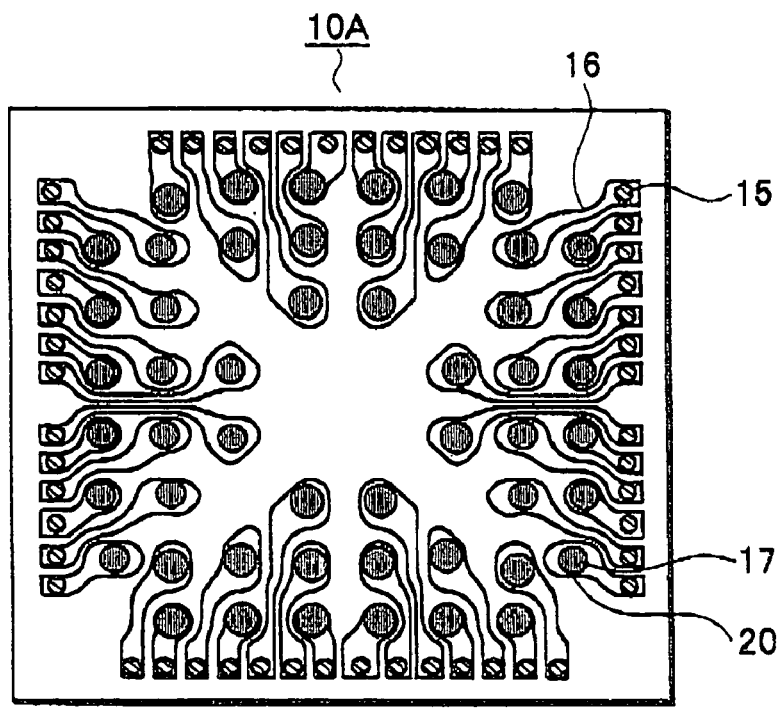

First, a description is given of a configuration of a circuit device 10A of an embodiment with reference to FIGS. 1A and 1B. FIG. 1A is a representative cross-sectional view of the circuit device 10A, and FIG. 1B is a plan view of a surface of the circuit device 10A in which external electrodes 17 and the like are formed.

Referring to FIG. 1A, the circuit device 10A includes a circuit element 11, connecting portions 15, redistribution lines 16, and pads 20. On a surface of the circuit element 11, electrodes 14 are formed. The connecting portions 15 are connected to exposed surfaces of the electrodes 14. The redistribution lines 16 are formed integrally with the respective connecting portions 15 and extended in parallel to the surface of the circuit element 11. The pads 20 are connected to the respective redistribution lines 16 and arranged in a matrix. On surfaces of the pads 20, the external electrodes 17 are individually formed.

The circuit element (semiconductor element) 11 includes a predetermined electrical circuit which is formed in a known diffusion process on a surface of a semiconductor substrate with a thickness of about 100 μm. Moreover, the surface of the circuit element 11 is coated with a protection film 12 which has a thickness of about several micrometers, in order to protect the electrical circuit 11 formed on the surface. The protection film 12 is a PSG (Phospho-Silicate-Glass) film, a $Si_3N_4$ (silicon nitride) film, or the like. The surfaces of the electrodes 14 are exposed from this protection film 12.

The electrodes 14 are connected to the electrical circuit formed on the surface of the circuit element 11, and a number of the electrodes 14 are located in a peripheral part of the circuit element 11. Generally, a material of the electrodes 14 is aluminum. Each electrode 14 is very minutely formed with a size of, for example, about 30 square μm to 50 square μm. A pitch of the electrodes 14 is also very small.

On the surface of each electrode 14, a barrier film may be formed. This barrier film can be made of Ti, Ta, TiN, TaN, TiW, TaW, WN, or the like. Moreover, these metals may be layered to form the barrier film. Forming the barrier film on the surfaces of the electrodes 14 is capable of preventing Cu, which is a material of the connecting portions 15, from being diffused to the electrodes 14, even when the connecting portion 15 abut on the electrodes 14.

The connecting portions 15 are made of rolled metal such as copper, and lower surfaces of the connecting portions 15 abut on the surfaces of the respective electrodes 14. A height of the connecting portions 15 is, for example, about 90 μm. Moreover, the connecting portions 15 are cylindrical or rectangular cylinder, and a width thereof is about 30 to 50 μm. The connecting portions 15 are elongated as described above, and thus the connecting portions 15 themselves are capable of being deformed to reduce a thermal stress. The connecting portions 15 are continuous to and integrated with the respective redistribution lines 16 and extend to the surfaces of the respective electrodes 14 by penetrating a filling resin 13.

Preferably, lower surfaces of the connecting portions 15 abutting on the surfaces of the electrodes 14 are roughened. This is capable of increasing a connection strength between the electrodes 14 and the connecting portions 15 which are joined to each other by pressure bonding. Furthermore, a surface of the connecting portion 15 abutting on each electrode 14 is partially buried in the electrode 14, and a joint reliability thereof is capable of being improved.

The electrodes 14 and the connecting portions 15 are joined to each other by pressure bonding, but can be connected with a conductive joint material such as solder or conductive paste. When the electrodes 14 and connecting portions 15 are joined using solder, solder with a melting point higher than that of solder constituting the external electrodes 17 is employed. The redistribution lines 16 are made of a metal integrated with the respective connecting portions 15 and extend in parallel to the surface of the circuit element 11. The redistribution lines 16 include a function to connect the electrodes 14 arranged in the peripheral part of the circuit element 11 at a small pitch with the pads 20 arranged in inner part of the circuit element 11 at a large pitch. The pitch of the electrodes 14 is, for example, about 50 to 70 μm, and the pitch of the pads 20 is, for example, about 500 μm. Connecting the pads 20 at the large pitch and the electrodes 14 at the small pitch using the redistribution lines 16 in such a manner is capable of facilitating mounting of the circuit device 10A. In other words, electrical conductive paths of a mounting substrate on which the circuit device 10A is to be mounted are not needed to be arranged at a fine pitch.

In this embodiment, each of the connecting portion 15 and the redistribution line 16 are integrally formed of one piece of metal. In other words, the path from each electrode 14 of the circuit element 11 to the external electrode 17 does not include a place where different materials are connected to each other. Accordingly, even when a thermal stress acts on the connecting portions 15 or the redistribution lines 16 due to a change in temperature or the like when the circuit device 10A is in use, a disconnection and the like are less likely to occur.

Furthermore, the connecting portions 15, the redistribution lines 16, and the pads 20 are made of rolled metal such as rolled copper and the like. Long axes of crystal grains constituting the rolled metal extend in parallel to a direction in which the redistribution lines 16 extend. Compared to metal formed by plating and the like, the rolled metal is superior in mechanical strength. Furthermore, the rolled metal is superior to the plated metal also in terms of flexibility. Based on the above description, the rolled metal is suitable as a metal integrally constituting each connecting portion 15 and the redistribution line 16 connected thereto.

Furthermore, the redistribution lines 16 are formed on an upper surface of the filling resin 13, which is provided to coat the protection film 12. Herein, a thickness of the filling resin 13 is about 90 µm, which is equal to a height of the connecting portions 15. In other words, the redistribution lines 16 extend so as to be distanced from the protection film 12, which protects the surface of the circuit element 11. Accordingly, even if a change in temperature produces different expansions in the redistribution lines 16 and the circuit element 11, the thermal stress is reduced by the filling resin 13, which is located between the redistribution lines 16 and the circuit element 11. It is therefore possible to prevent a reduction in the joint reliability caused by the thermal stress.

The filling resin 13 can be either a thermoplastic resin or a thermosetting resin. Alternatively, the filling resin 13 can be resin such as epoxy resin mixed with filler. The filling resin 13 mixed with the filler can improve heat radiation and furthermore bring a thermal expansion coefficient of the filling resin 13 close to that of the circuit element 11. The filler can be fibers or particles of $SiO_2$, SiN, $Al_2O_3$, or the like.

The pads 20 are formed in a matrix within an area surrounded by the electrodes 14 in the circuit element 11. The pitch between the pads 20 is, for example, about 500 µm. As described above, the pads 20 are made of a metal integrated with the respective connecting portions 15 and the redistribution lines 16. On the surfaces of the pads 20, the external electrodes 17 are individually formed.

The external electrodes 17 are made of solder, conductive paste, or the like and bonded to exposed surfaces of the pads 20 each being partially exposed from a resist 19. As described above, the pitch of the external electrodes 17 is as large as, for example, about 500 µm.

The surfaces of the redistribution lines 16 and the filling resin 13 are coated with the resist 19 except areas where the external electrodes 17 are formed.

Referring to FIG. 1B, the connecting portions 15 connected to the electrodes 14 of the circuit element 11 are located in the peripheral part of the circuit device 10A. The pads 20 and the external electrodes 17 are arranged in a matrix within an area surrounded by the connecting portions 15. The redistribution lines 16 extend between the connecting portions 15 and the pads 20.

Figure 2A:
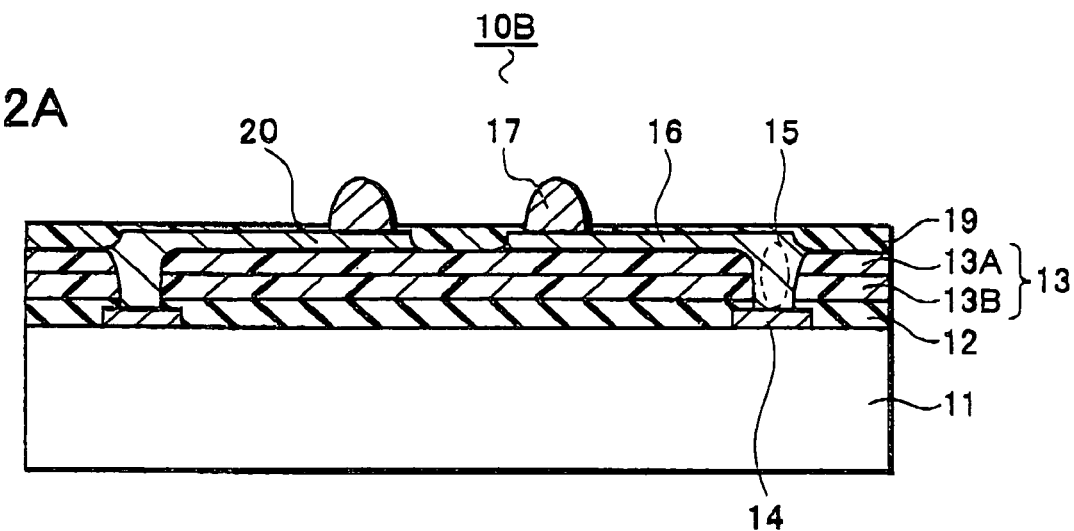
FIGS. 2A and 2B are cross-sectional views showing circuit devices of preferred embodiments of the present invention.
Figure 2B:
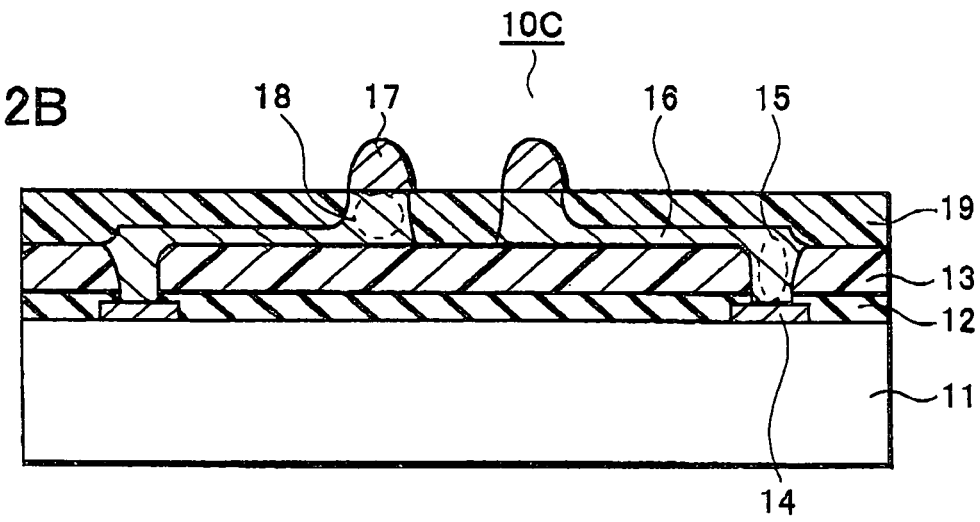

With reference to FIGS. 2A and 2B, a description is given of configurations of circuit devices 10B and 10C of other embodiments. FIGS. 2A and 2B are cross-sectional views of the circuit devices 10B and 10C, respectively.

Referring to FIG. 2A, in the circuit device 10B, a filling resin 13 is composed of a first filling resin 13A and a second filling resin 13B. The other configuration of the circuit device 10B is the same as that of the circuit device 10A.

The first filling resin 13A is resin formed on the redistribution lines 16 side and composed of resin mixed with filler. The first filling resin 13A is formed before the connecting portions 15 are caused to abut on electrodes 14. Accordingly, a large amount of filler (for example, 50 wt % or more) can be mixed. A method of forming the first filling resin 13A and the like are described later.

The second filling resin 13B is a resin provided on the circuit device 11 side and composed of epoxy resin or the like which is basically not mixed with filler. If the second filling resin 13B is mixed with filler, an amount of the filler is less than that of the first filling resin 13A. Space between the first filling resin 13A and a protection resin 12 is filled with the second filling resin 13B after the connecting portions 15 are caused to abut on the electrodes 14.

Referring to FIG. 2B, in the circuit device 10C, posts 18 extending upward and protruding from respective redistribution lines 16 are formed. A thickness of the posts 18 is, for example, about 100 to 200 µm. Upper surfaces of the posts 18 are exposed from a resist 19, and external electrodes 17 are bonded thereto. The posts 18 are deformable according to a stress laterally acting thereon. It is therefore possible to reduce a thermal stress acting on the external electrodes 17 and thus improve a joint reliability of the external electrodes 17. Furthermore, the posts 18 are formed of a rolled metal integrated with the respective redistribution lines 16 and connecting portions 15 and have a high joint reliability against a thermal stress. The other configuration of the circuit device 10C is the same as that of the circuit device 10A.

Figure 3A:
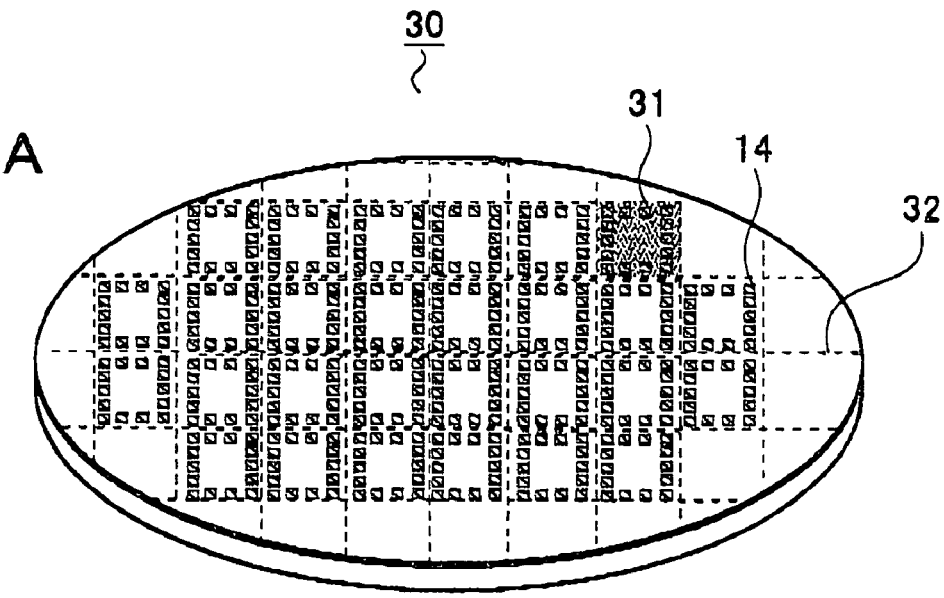
FIGS. 3A to 3C are perspective views and a cross sectional view showing a method of manufacturing a circuit device of preferred embodiments of the present invention, respectively.

Next, a description is given of a method of manufacturing the above circuit devices with reference to the drawings from FIG. 3A.

Figure 3B:
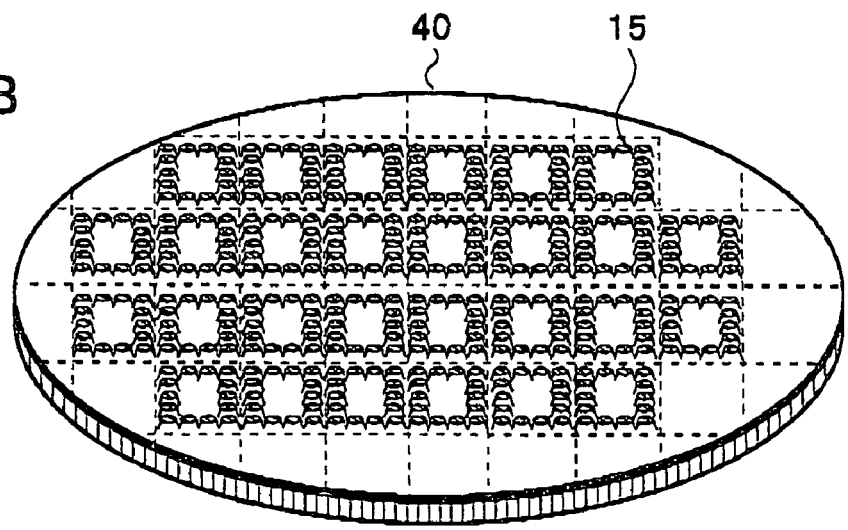
Figure 3C:
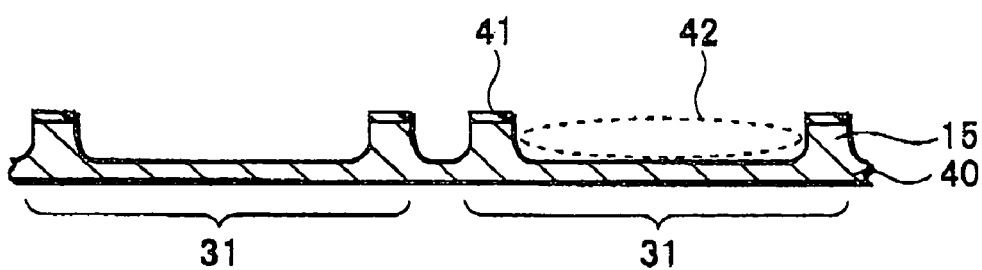

Referring to FIGS. 3A to 3C, first, a semiconductor wafer 30 and a conductive foil 40 are prepared. FIGS. 3A to 3C are a perspective view of the semiconductor wafer 30, a perspective view of the conductive foil 40, and a cross-sectional view of the conductive foil 40, respectively.

Referring to FIG. 3A, on a surface of the semiconductor wafer 30 subjected to a diffusion process and the like, integrated circuits are formed in a matrix. Electrodes 14 connected to each integrated circuit are formed in a peripheral part of the semiconductor wafer 30. In the following description, the integrated circuit and the electrodes 14 which serve as one circuit device are referred to as a unit 31. Between each unit 31, a dicing line 32 is located.

Referring to FIGS. 3B and 3C, next, connecting portions 15 which are protruded are formed on a surface of the conductive foil 40. A plane size of the conductive foil 40 is substantially equal to that of the semiconductor wafer 30. Specifically, when the semiconductor wafer 30 has a diameter of 8 inches (200 mm), the conductive foil 40 whose size is substantially equal to this size of the semiconductor wafer 30 is prepared. A thickness of the conductive foil 40 is, for example, about 120 µm.

The connecting portions 15 are formed by selectively etching a surface of the conductive foil 40. Specifically, sections in the surface of the conductive foil 40 in which the connecting portions 15 are to be formed are coated with an etching resist 41, and then the surface of the conductive film 40 is etched. On the surface of the conductive foil 40, an isolation trench 42 is thus formed, and the connecting portions 15 which are not etched are convexly protruded. A height of the connecting portions 15 is, for example, about 90 µm. Two dimensional positions of the connecting portions 15 accurately correspond to those of respective electrodes 14 formed on the surface of the semiconductor wafer 30. Herein, a pitch of the connecting portions 15 formed in an etching process is capable of being formed to be very minute, which is, for example, about 10 µm.

Preferably, upper surfaces of the connecting portions 15 are subjected to a roughening process. The roughening process is capable of increasing, in a subsequent process, a joint reliability between the electrodes 14 of the semiconductor wafer and the connecting portions 15. The roughening process of the upper surfaces of the connecting portions 15 can be performed by etching, a CZ process, a plasma treatment, or the like. Herein, the CZ process is a roughening process performed using a liquid mixture of formic acid and hydrochloric acid.

Next, a description is given of subsequent processes with reference to cross-sectional views of FIGS. 4A to 4E. In FIGS. 4A to 4E, a method of manufacturing the circuit device 10A shown in FIGS. 1A and 1B is described.

Figure 4A:
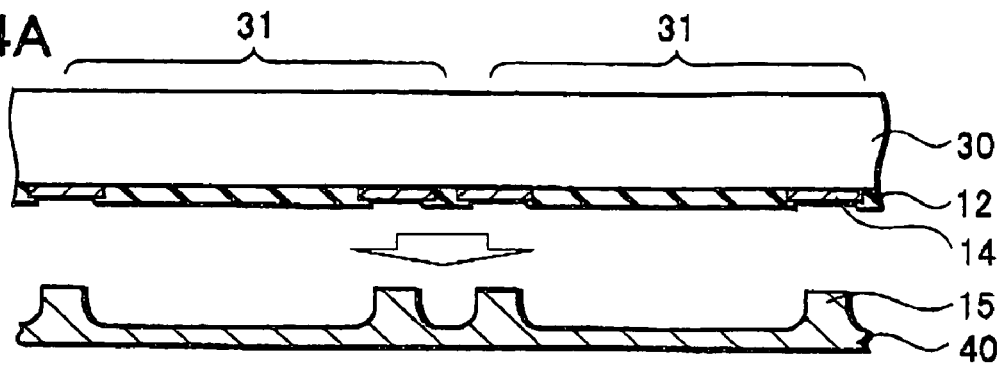
FIGS. 4A to 4E are cross-sectional views showing a method of manufacturing a circuit device of preferred embodiments of the present invention.
Figure 4B:
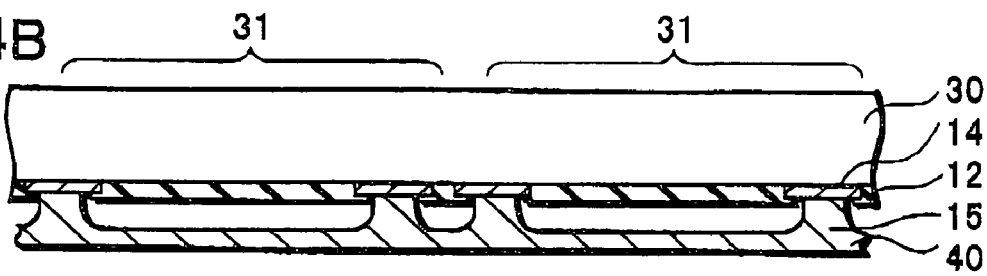

Referring to FIGS. 4A and 4B, next, the semiconductor wafer 30 and the conductive foil 40 are superimposed on each other so that the upper surfaces of the connecting portions 15 are pressure-bonded to the respective electrodes 14 of each unit 31. Herein, the conductive foil 40 is placed on a horizontal table, and the semiconductor wafer 30 is placed on an upper side of the conductive foil 40. The semiconductor wafer 30 is superimposed on the conductive foil 40 so that positions of the electrodes 14 correspond to positions of the connecting portions 15 while the positions of the electrodes 14 and the connecting portions 15 are being checked with a camera. The connecting portions 15 and the electrodes 14 are connected by pressure bonding but may be connected using a conductive joint material such as solder or conductive paste. The connecting portions 15 and the electrodes 14 which are pressure-bonded are shown in FIG. 4B. Since a thickness of the semiconductor wafer 30 is as large as, for example, about 600 µm, a warpage or cracks are less likely to occur in moving the semiconductor wafer 30 in this process.

Figure 4C:
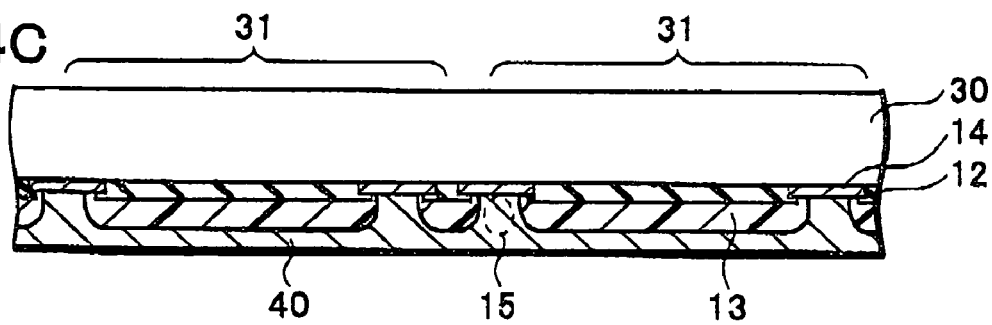

Referring to FIG. 4C, next, space between the conductive foil 40 and the semiconductor wafer 30 is filled with a filling resin 13. The filling resin 13 can be either thermoplastic resin or thermosetting resin. When the thermosetting resin such as epoxy resin is employed as the filling resin 13, the liquid filling resin 13 which is filled is heat hardened. In this embodiment, the connecting portions 15 are formed by etching, and a side face of each connecting portion 15 therefore has a shape broadening toward a bottom the connecting portion 15. Accordingly, a connecting portion between the connecting portions 15 and the conductive foil 40 is easily filled with the filling resin 13.

Figure 4D:
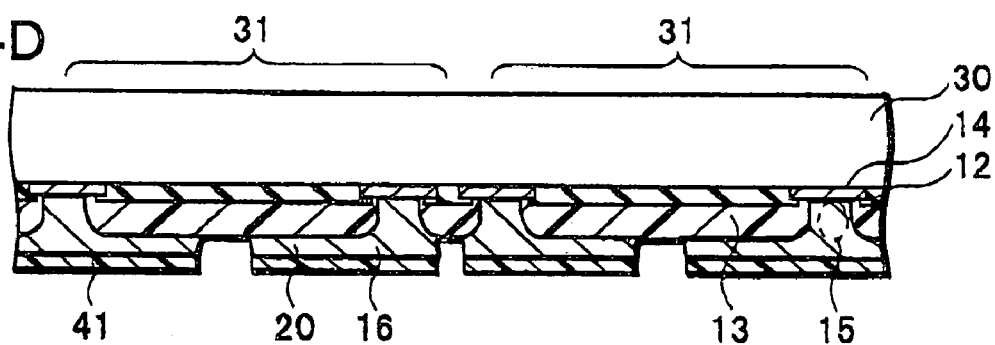

Referring to FIG. 4D, next, the conductive foil 40 is etched from a rear surface to form redistribution lines 16 and pads 20. Specifically, etching is performed, after sections of the conductive foil corresponding to sections in which the redistribution lines 16 and pads 20 are to be formed, are coated with the etching resist 41. In this process, a thickness of the conductive foil 40 in an area in which etching is performed is about 30 µm, and the redistribution lines 16 and the pads 20 are capable of being formed to be minute. Furthermore, in this process, the conductive foil 40 is removed from between each unit 31 by etching.

Figure 4E:
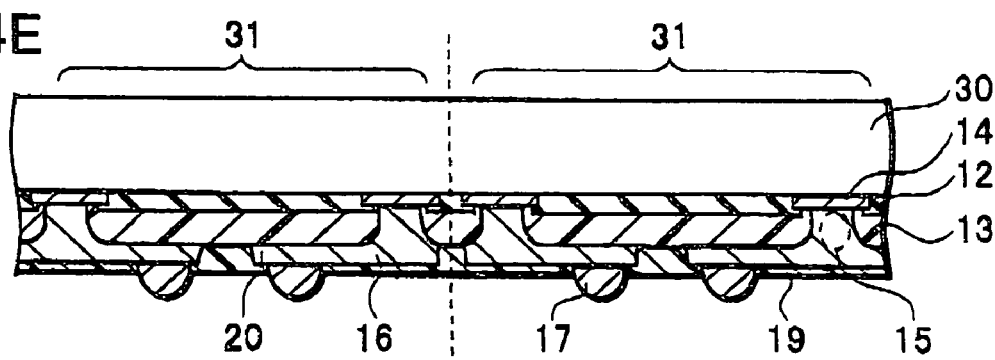

Referring to FIG. 4E, next, resist 19 is formed so that the redistribution lines 16 and the pads 20 are coated with the resist 19. The resist 19 is partially removed so that a rear surface of each pad 20 is partially exposed. Furthermore, external electrodes 17 made of solder or the like are bonded to surfaces of the respective pads 20 exposed from the resist 19. After the end of this process, the semiconductor wafer 30 is diced at places indicated by dashed lines to separate each unit 31.

With the aforementioned processes, the circuit device 10A shown in FIGS. 1A and 1B is manufactured.

Next, a description is given of a method of manufacturing the circuit device 10B shown in FIG. 2A. This manufacturing method is different from the aforementioned manufacturing method in that a filling resin 13 is composed of a first filling resin 13A and a second filling resin 13B.

Figure 5A:
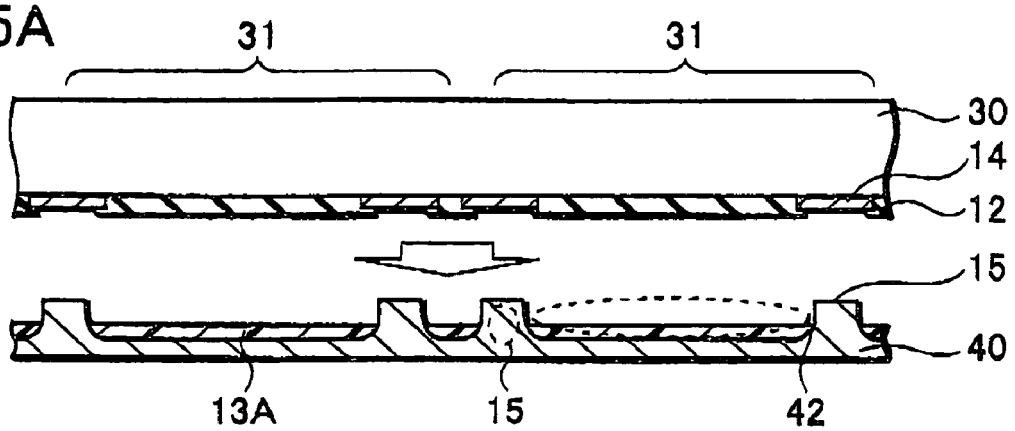
FIGS. 5A to 5D are cross-sectional views showing a method of manufacturing a circuit device of preferred embodiments of the present invention.

Referring to FIG. 5A, first, a semiconductor wafer 30 and a conductive foil 40 are superimposed on each other so that upper surfaces of connecting portions 15 abut on respective electrodes 14. This method is the same as the aforementioned method. Herein, before the semiconductor wafer 30 and the conductive foil 40 are superimposed on each other, the first filling resin 13A is applied to an isolation trench 42 formed in the surface of the conductive foil 40. The first filling resin 13A is composed of resin mixed with filler.

A method of applying the first filling resin 13A to fill the isolation trench 42 with the first filling resin 13A is as follows. First, the first filling resin 13A is applied to an entire surface of the conductive foil 40. Next, the first filling resin 13A is scratched away using a squeegee so as to be thinned in sections in which the connecting portions 15 are coated with the first filling resin 13A. Furthermore, when the first filling resin 13A is thermosetting resin, heat hardening is performed. Next, the conductive foil 40 is immersed in a solution of potassium permanganate. The first filling resin 13A is therefore thinned overall, and upper surfaces of the connecting portions 15 are exposed from the first filling resin 13A.

The first filling resin 13A is mixed with a large amount of filler and has a low fluidity in some cases. Accordingly, it is difficult to fill a space between the semiconductor wafer 30 and the conductive foil 40 with the first filling resin 13A after the semiconductor wafer 30 and the conductive foil 40 are superimposed on each other. In this embodiment, therefore, the first filling resin 13A is previously formed on the surface of the conductive foil 40.

Figure 5B:
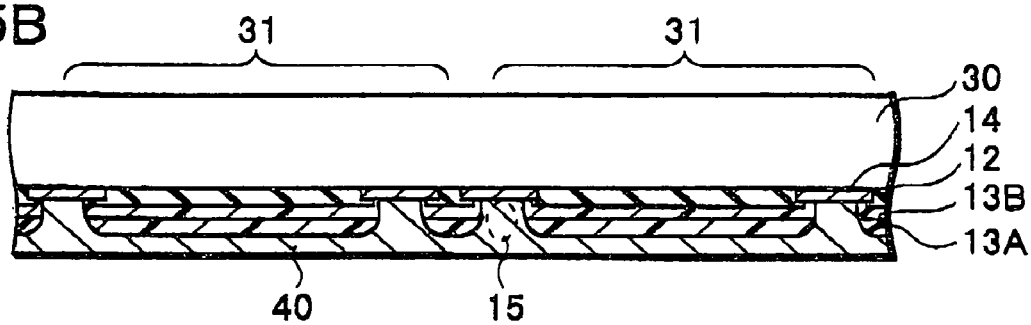

Referring to FIG. 5B, next, a space between the conductive foil 40 and the semiconductor wafer 30 is filled with the second filling resin 13B. The space between the conductive foil 40 and the semiconductor wafer 30 is narrowed since the first filling resin 13A is formed on the surface of the conductive foil 40. For example, when a thickness of the first filling resin 13A is about 50 µm, a space between the first filling resin 13A and the semiconductor wafer 30 is about 40 µm thick. Accordingly, the space between the first filling resin 13A and the semiconductor wafer 30 is capable of being easily filled with the second filling resin 13B by a capillary action to prevent a formation of voids.

The second filling resin 13B is composed of resin such as epoxy resin and the like not mixed with filler. Alternatively, if the second filling resin 13B is mixed with filler, an amount of the filler is less than that of the first filling resin 13A. Accordingly, the second filling resin 13B is excellent in a fluidity, and is capable of filling a narrow space as described above.

Figure 5C:
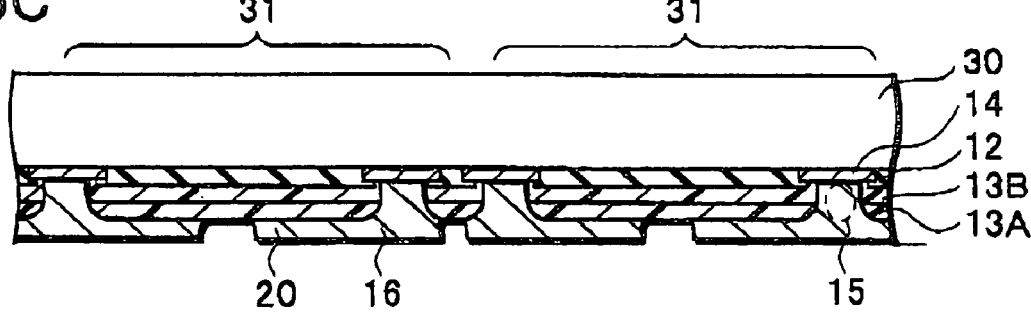

Referring to FIG. 5C, next, the conductive foil 40 is selectively etched to form redistribution lines 16 and pads 20.

Figure 5D:
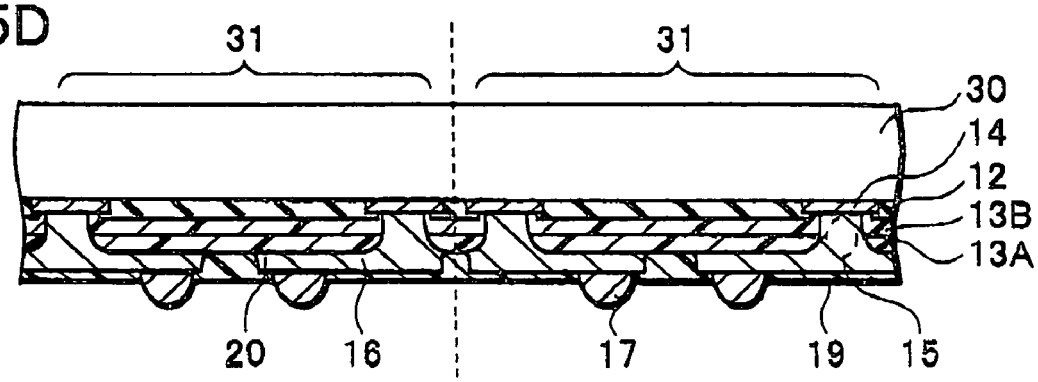

Referring to FIG. 5D, next, resist 19 is formed so that the redistribution lines 16 and the pads 20 are coated with the resist 19. Furthermore, external electrodes 17 are formed on the respective pads 20 exposed from the resist 19. Finally, the semiconductor wafer 30 is diced at places indicated by dashed lines so as to separate each unit 31, thus obtaining individual circuit devices. The circuit device 10B shown in FIG. 2A is manufactured in the aforementioned process.

Next, with reference to FIGS. 6A to 6D, a description is given of a method of manufacturing a circuit device 10C whose configuration is shown in FIG. 2B. This manufacturing method is different from the aforementioned manufacturing method in manufacturing posts 18.

Figure 6A:
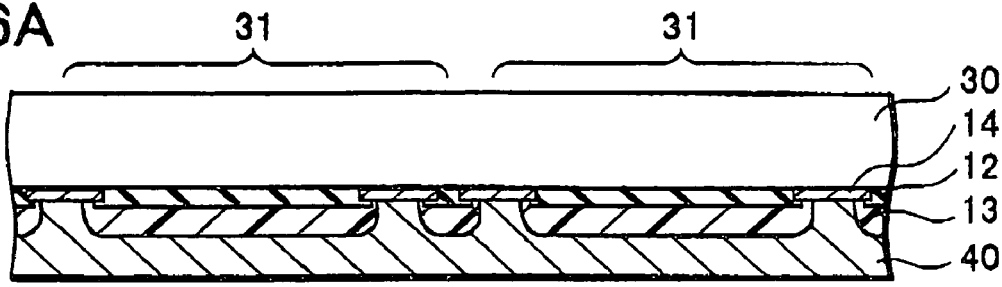
FIGS. 6A to 6D are cross-sectional views showing a method of manufacturing a circuit device of preferred embodiments of the present invention.

Referring to FIG. 6A, first, a conductive foil 40 and a semiconductor wafer 30 are superimposed on each other, and a space formed between the conductive foil 40 and the semiconductor wafer 30 is filled with a filling resin 13. Herein, as described above, the filling resin 13 may be composed of a first filling resin 13A and a second filling resins 13B.

Figure 6B:
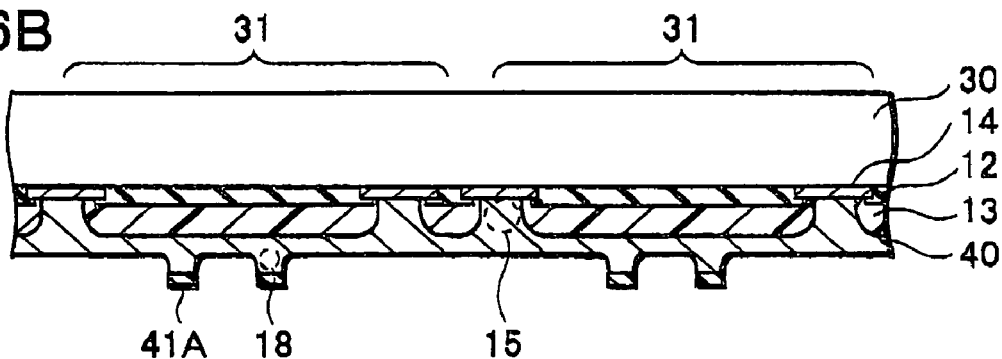

Referring to FIG. 6B, next, a rear surface of the conductive foil 40 where the posts 18 are to be formed are coated with an etching resist 41A, and then the conductive foil 40 is etched from the rear surface. The posts 18 convexly protruding downward of the paper are formed in this process.

Figure 6C:
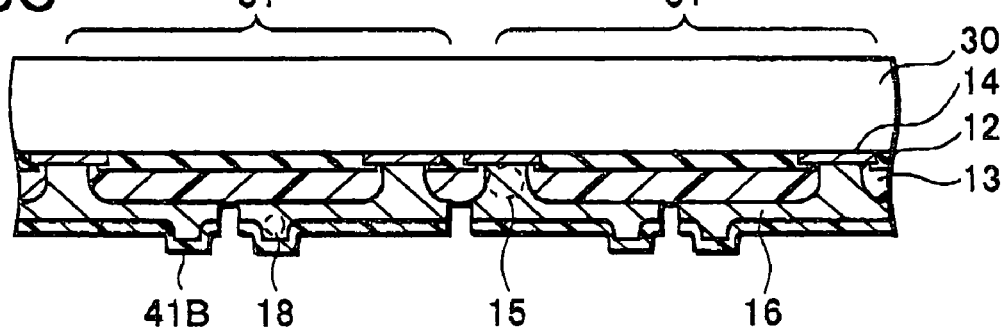

Referring to FIG. 6C, next, the rear surface of the conductive foil 40 is coated with a different etching resist 41B, and then etching is performed to form redistribution lines 16.

Figure 6D:
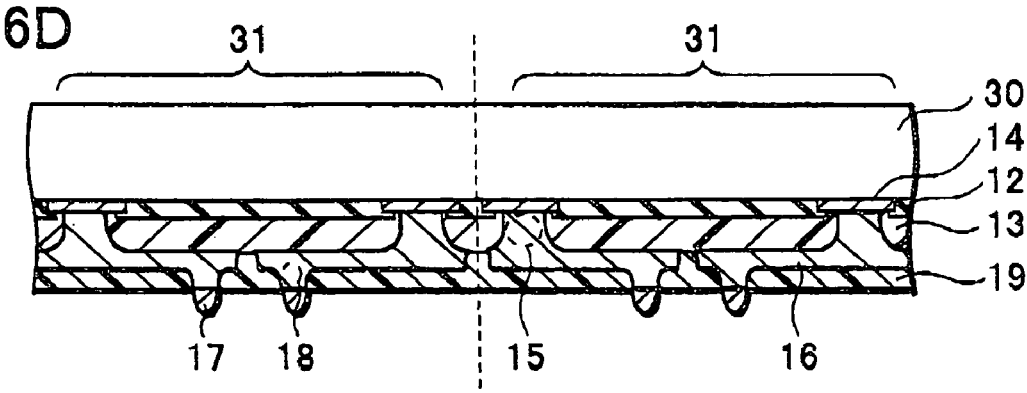
Figure 7:
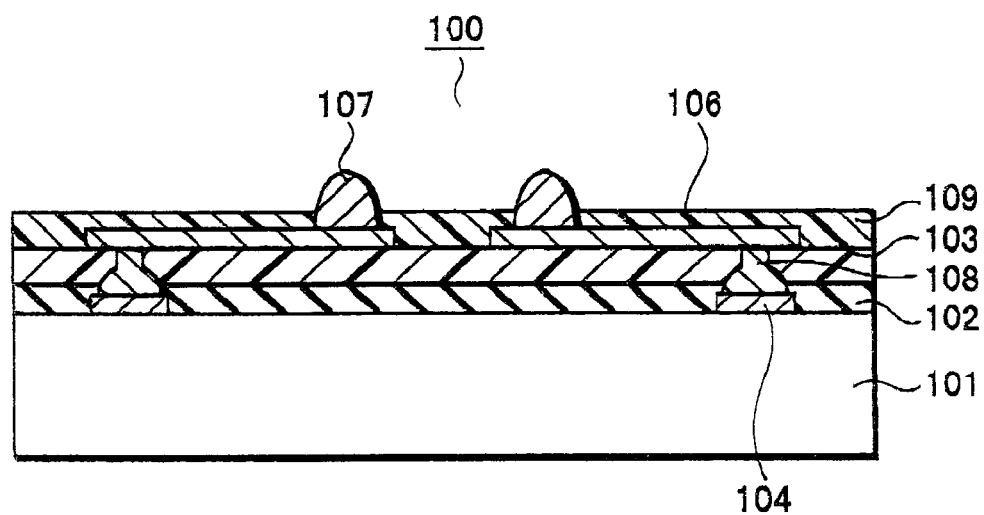
FIG. 7 is a cross-sectional view showing a conventional circuit device.

Referring to FIG. 6D, next, the redistribution lines 16 are coated with a resist 19 in a way that an upper portion of the posts 18 are exposed from the resist 19. On the posts 18 exposed from the resist 19, the external electrodes 17 made of solder or the like are bonded.

In the aforementioned processes, the circuit device 10C whose structure is shown in FIG. 2B is formed.

With the circuit device of the embodiments of the present invention, the connecting portion connected to the electrode of the circuit element and the retribution line is capable of being integrally formed of one piece of metal. It is therefore possible to improve the joint reliability against thermal stress in a path from the electrode of the circuit element to the external electrode.

Moreover, the connecting portion and redistribution line are formed of rolled metal. Accordingly, the joint reliability against the thermal stress is capable of being further improved.

Furthermore, the redistribution line is formed to be distanced from a protection film protecting the surface of the circuit element. In other words, a height of the connecting portion is designed to be higher than a thickness of the protection film. Accordingly, the connecting portion which is formed to be high is deformed following a change in temperature, and is capable of reducing the thermal stress, thus improving the joint reliability.

Still furthermore, mixing a filler in the filling resin located between the circuit element and the redistribution line is capable of improving a heat radiation of the entire circuit device.

Still furthermore, according to the method of manufacturing the circuit device of the embodiments of the present invention, the connecting portion and the redistribution line are minutely formed by etching. Accordingly, the embodiments of the present invention can be applied to a circuit element having minute electrodes formed at a small pitch. It is therefore possible to configure the circuit device adopting the sophisticated circuit element.

Still furthermore, the path from the electrode of the circuit element to the external electrode is capable of being formed of one conductive foil by etching. Therefore a manufacturing process of the CSP-type circuit device is capable of being simplified, and furthermore, manufacturing costs are capable of being reduced.

Still furthermore, an upper surface of the connecting portion is caused to abut on the electrode of the circuit element after the upper surface of the connecting portion is roughened. Accordingly, the joint reliability between the connecting portion and the electrode is capable of being improved.

What is claimed is:

1. A circuit device comprising:
   a circuit element; and
   a connecting portion connected to an electrode of the circuit element, wherein the connecting portion protrudes toward the electrode of the circuit element, wherein a side surface of the connecting portion is curved such that the connecting portion has a shape that broadens towards its redistribution line, wherein the connecting portion has an end that narrows as the end nears the electrode and that abuts the electrode;
   wherein the redistribution line is continuous with the connecting portion and extends substantially in parallel to a main surface of the circuit element,
   wherein the connecting portion and the redistribution line are integrally formed of one piece of metal, wherein the redistribution line and the connecting portion are made of rolled metal.

2. The circuit device according to claim 1, wherein
   the redistribution line is coated with a resist, and
   a post continuous to the redistribution line is exposed to an outside of the circuit device by penetrating the resist.

3. The circuit device according to claim 2, wherein the post is formed of a metal integrated with the connecting portion and the redistribution line.

4. The circuit device according to claim 1, further comprising:
   a protective film covering a surface of the circuit element, wherein the protective film comprises silicon nitride or phospho-silicate glass; and
   a filling resin covering the protective film, wherein the redistribution line is on a surface of the filling resin.

5. A circuit device according to claim 4 wherein the filling resin comprises a first filling resin and a second different filling resin.

6. The circuit device according to claim 4 wherein:
   the filling resin comprises a first filling resin adjacent to the redistribution line and a second, different filling resin adjacent to the circuit device; and
   an amount of filler mixed in the second filling resin is less than an amount of filler in the first filling resin.

7. The circuit device according to claim 4 wherein the redistribution line comprises crystal grains and long axes of the crystal grains extend in parallel to a direction in which the redistribution line extend.

8. The circuit device according to claim 1, wherein the redistribution line extends so as to be distanced from a protection film covering a surface of the circuit element.

9. The circuit device according to claim 1, wherein a surface of the connecting portion abutting on a surface of the electrode of the circuit element is roughened.

10. A circuit device according to claim 1 wherein the side surface of the connecting portion inclines to main surface of the electrode of the circuit element.

11. A circuit device comprising
    a circuit element;
    a connecting portion connected to an electrode of the circuit element, wherein the connecting portion protrudes toward the electrode of the circuit element and is cylindrically shaped or shaped as a rectangular cylinder, wherein the connecting portion has an end that narrows as the end nears the electrode and that abuts the electrode; and
    a redistribution line which is continuous with the connecting portion and extends substantially in parallel to a main surface of the circuit element,
        wherein the connecting portion and the redistribution line are integrally formed of one piece of metal,
        wherein the redistribution line and the connecting portion are made of rolled metal; and
    wherein the connecting portion and the redistribution line are configured to be interposed to each other where the connecting portion is disposed.

12. A circuit device according to claim 11 wherein a side surface of the connecting portion inclines to main surface of the electrode of the circuit element.

13. A circuit device, comprising:
    a circuit element;
    a connecting portion connected to an electrode of the circuit element, wherein the connecting portion protrudes toward the electrode of the circuit element, wherein the connecting portion is cylindrically shaped or shaped as a rectangular cylinder, wherein the connecting portion has an end that narrows as the end nears the electrode and that abuts the electrode; and a redistribution line which is continuous to the connecting portion and extended in parallel to a main surface of the circuit element substantively, wherein the connecting portion and the redistribution line are integrally formed of one piece of metal, wherein the redistribution line and the connecting portion are made of rolled metal.

14. A circuit device according to claim 13 wherein a side surface of the connecting portion inclines to main surface of the electrode of the circuit element.

* * * * *